United States Patent
Tursi et al.

(10) Patent No.: US 7,015,729 B1
(45) Date of Patent: Mar. 21, 2006

(54) APPARATUS AND METHOD FOR SAMPLE-AND-HOLD WITH BOOSTED HOLDING SWITCH

(75) Inventors: Maria R. Tursi, Munich (DE); Robert C. Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/816,322

(22) Filed: Mar. 30, 2004

Related U.S. Application Data (60) Provisional application No. 60/546,706, filed on Feb. 20, 2004.

(51) Int. Cl.
*G11C 27/02* (2006.01)
(52) U.S. Cl. .................................................. 327/94
(58) Field of Classification Search ............... 327/91, 327/94, 96, 337, 554, 589, 390; 341/122
See application file for complete search history.

(56) References Cited

U.S. PATENT DOCUMENTS

| | | | | |
|---|---|---|---|---|
| 4,563,588 A | * | 1/1986 | Tanaka | 250/458.1 |
| 4,781,437 A | * | 11/1988 | Shields et al. | 345/87 |
| 5,324,995 A | * | 6/1994 | Yee | 327/91 |
| 5,416,432 A | * | 5/1995 | Lewis et al. | 327/60 |
| 6,069,502 A | * | 5/2000 | Preslar et al. | 327/94 |

OTHER PUBLICATIONS

K. Nagaraj, D. Martin, M. Wolfe, R. Chattopadhyay, S. Pavan, J. Cancio anc T.R. Viswanathan, "A Dual-Mode 700-Msamples/s 6-bit 200-Msamples/s 7-bit A/D Converter in a 0.25um Digital CMOS Process", IEEE Journal of Solid-State Circuits, vol. 35, No. 12, pp. 1760-1768, Dec. 2000.
C. Eichenberger and W. Guggenbuhl, "Dummy Transistor Compensation of Analog MOS Switches", IEEE Journal of Solid-State Circuits, vol. 24, No. 4, pp. 1143-1146, Aug. 1989.

* cited by examiner

*Primary Examiner*—My-Trang Nu Ton
(74) *Attorney, Agent, or Firm*—Darby & Darby PC; Matthew M. Gaffney (57) ABSTRACT

A pipelined sample-and-hold circuit is provided. The circuit is pipelined such that processing of a held signal can continue into the next sample phase. Also, the pipelined sample-and-hold circuit includes a hold switch. The hold switch includes a boosted switch and dummy circuits. The boosted switch circuit is responsive to a boosted signal. The dummy circuits are arranged for charge injection cancellation responsive to another boosted signal that is a substantially inverse of the boosted signal.

22 Claims, 11 Drawing Sheets

APPARATUS AND METHOD FOR SAMPLE-AND-HOLD WITH BOOSTED HOLDING SWITCH

RELATED APPLICATION

This application claims the benefit of U.S. Provisional Application No. 60/546,706 filed Feb. 20, 2004, the benefit of the earlier filing date of which is hereby claimed under 35 U.S.C. § 119 (e).

FIELD OF THE INVENTION

The invention is related to sample-and-hold circuits, and in particular, to an apparatus and method for a pipelined sample-and-hold circuit that includes a boosted hold switches that include dummies.

BACKGROUND OF THE INVENTION

An analog-to-digital converter (ADC) is employed to change/convert an analog input signal into a digital output signal. There are several different types of ADCs in current use, including pipeline, flash, and folding. For pipeline ADCs, separate decoding stages are arranged in a pipeline to convert the analog signal into a digital signal.

In a flash ADC, k bits of resolution employ $2^k$ comparators to convert an analog signal into a digital signal. Folding ADCs are a variation of a typical flash ADC architecture except that they are arranged to map the analog input signal range into N regions where each of these N regions share the same comparators. In a folding ADC, the total number of comparators is typically $2^k/N$. Also, a folding ADC includes a coarse channel for determining from which of the N input regions the analog input signal originated. Usually, the coarse channel is configured to use coarse reference voltages that are spaced according to the voltage spacing between each folded region.

An ADC may employ a sample-and-hold circuit to relax the timing requirements of the ADC.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a pipelined sample-and-hold circuit. The circuit is pipelined such that processing of a held signal can continue into the next sample phase. Also, the pipelined sample-and-hold circuit includes a hold switch. The hold switch includes a boosted switch circuit and dummy circuits. The boosted switch circuit is responsive to a boosted signal. The dummy circuits are arranged for charge injection cancellation responsive to another boosted signal that is a substantially inverse of the boosted signal.

Figure 1:
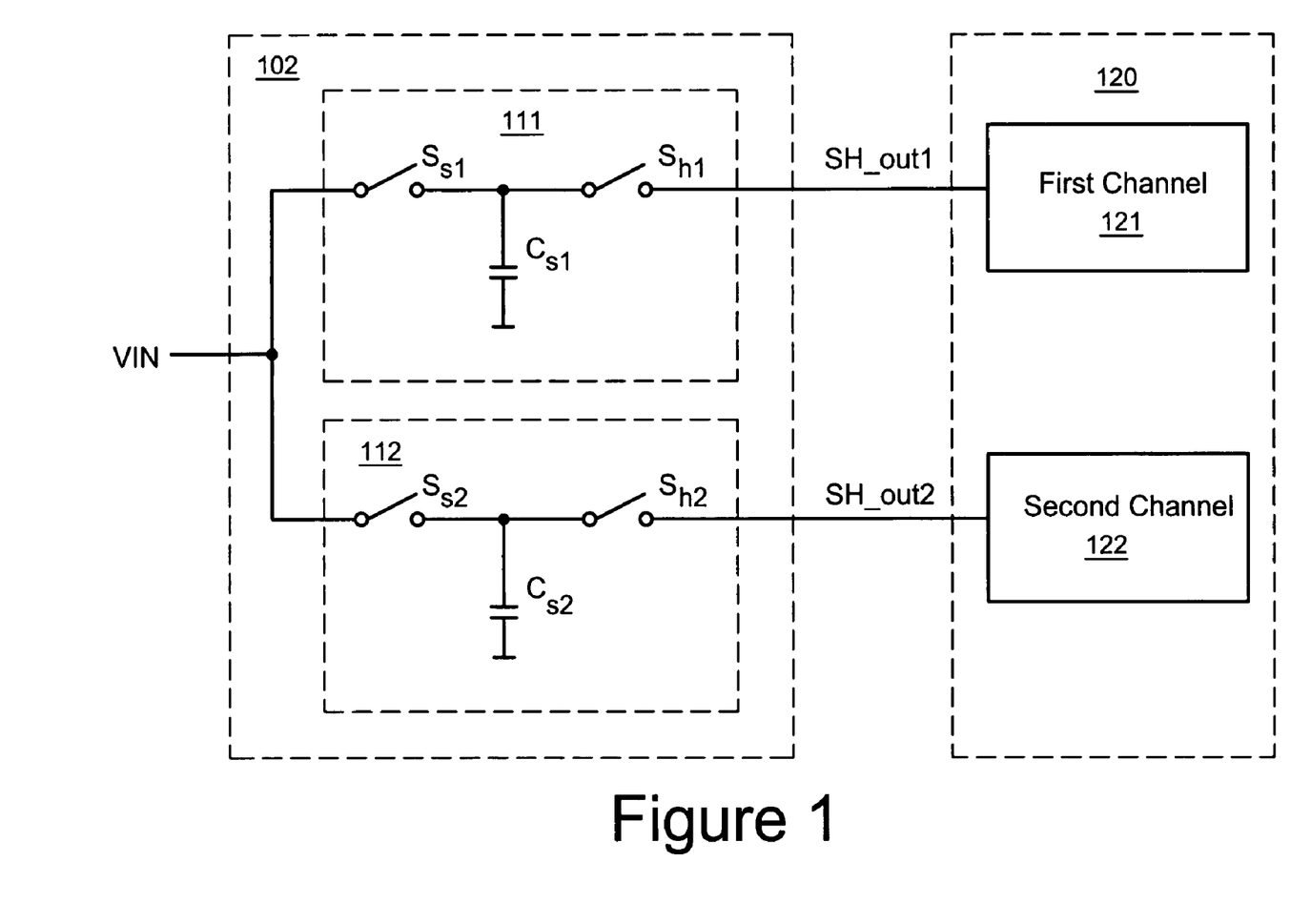
FIG. 1 shows a block diagram of a circuit for sampling and holding.

FIG. 1 shows a block diagram of circuit 100. Circuit 100 may include sample-and-hold circuit 102 and processing circuit 120. Processing circuit 120 may be interleaved such that it includes first channel 121 and second channel 122. Similarly, sample-and-hold circuit 102 may be interleaved such that it includes sample-and-hold channel 111 and sample-and-hold channel 112. Sample-and-hold channel 111 includes sampling switch circuit $S_{s1}$, capacitor circuit $C_{s1}$, and holding switch circuit $S_{h1}$. Similarly, sample-and-hold channel 112 includes sampling switch circuit $S_{s2}$, capacitor circuit $C_{s2}$, and holding switch circuit $S_{h2}$.

In operation, during a sample phase for sample-and-hold channel 111, sampling switch circuit $S_{s1}$ is closed and switch circuit $S_{h1}$ is open. During the sample phase for sample-and-hold channel 111, sampling capacitor circuit $C_{s1}$ may sample voltage VIN. Similarly, sample-and-hold channel 111 is arranged such that, during a hold phase for sample-and-hold channel 111, sampling switch circuit $S_{s1}$ is open and switch circuit $S_{h1}$ is closed. Also, during the hold phase for sample-and-hold channel 111, switch circuit $S_{h1}$ is arranged to provide signal SH_out1 to first channel 121.

First channel 121 may continue processing signal SH_out1 during the subsequent sample phase. Since switch circuit $S_{h1}$ is open, first channel 121 does not receive a new signal until the next hold phase for sample-and-hold channel 111. This way, first channel 121 can use the hold phase for sample-and-hold channel 111 and the subsequent sample phase for sample-and-hold channel 111 to process signal SH_out1 until the next sampled signal needs to be processed by first channel 121.

In a similar manner, sample-and-hold channel 112 is arranged such that, during a sample phase for sample-and-hold channel 112, sampling switch circuit $S_{s2}$ is closed and holding switch circuit $S_{h2}$ is open. During the sample phase for sample-and-hold channel 112, sampling capacitor circuit Cs2 may sample voltage VIN. Also, sample-and-hold channel 112 is arranged such that, during a hold phase for sample-and-hold channel 112, sampling switch circuit $S_{s2}$ is open and holding switch circuit $S_{h2}$ is closed. As described with regard to switch circuit $S_{h1}$ above, second channel 122 can use the hold phase for the sample-and-hold channel 112 and the subsequent sample phase for sample-and-hold channel 112 to process signal SH_out2 until the next sample needs to be processed by second channel 122.

In one embodiment, by pipelining sample-and-hold circuit 102 in two in the manner described, the speed of sample-and-hold circuit 102 is substantially doubled, without substantially decreasing the processing time allowed for processing circuit 120. In other embodiments, sample-and-hold circuit 102 may be pipelined by more than two.

Processing circuit 120 may be interleaved such that first channel 121 and second channel 122 are substantially similar.

In one embodiment, signals VIN, SH_out1 and SH_out2 are all single-ended signals. In other embodiments, one or more of signal VIN, SH_out1 and SH_out2 are differential signals. In another embodiment, although not shown, circuit 100 may be arranged to operate in single-ended mode if signal SE (not shown) is asserted, and to operate in differential mode if signal SE is not asserted.

Figure 2:
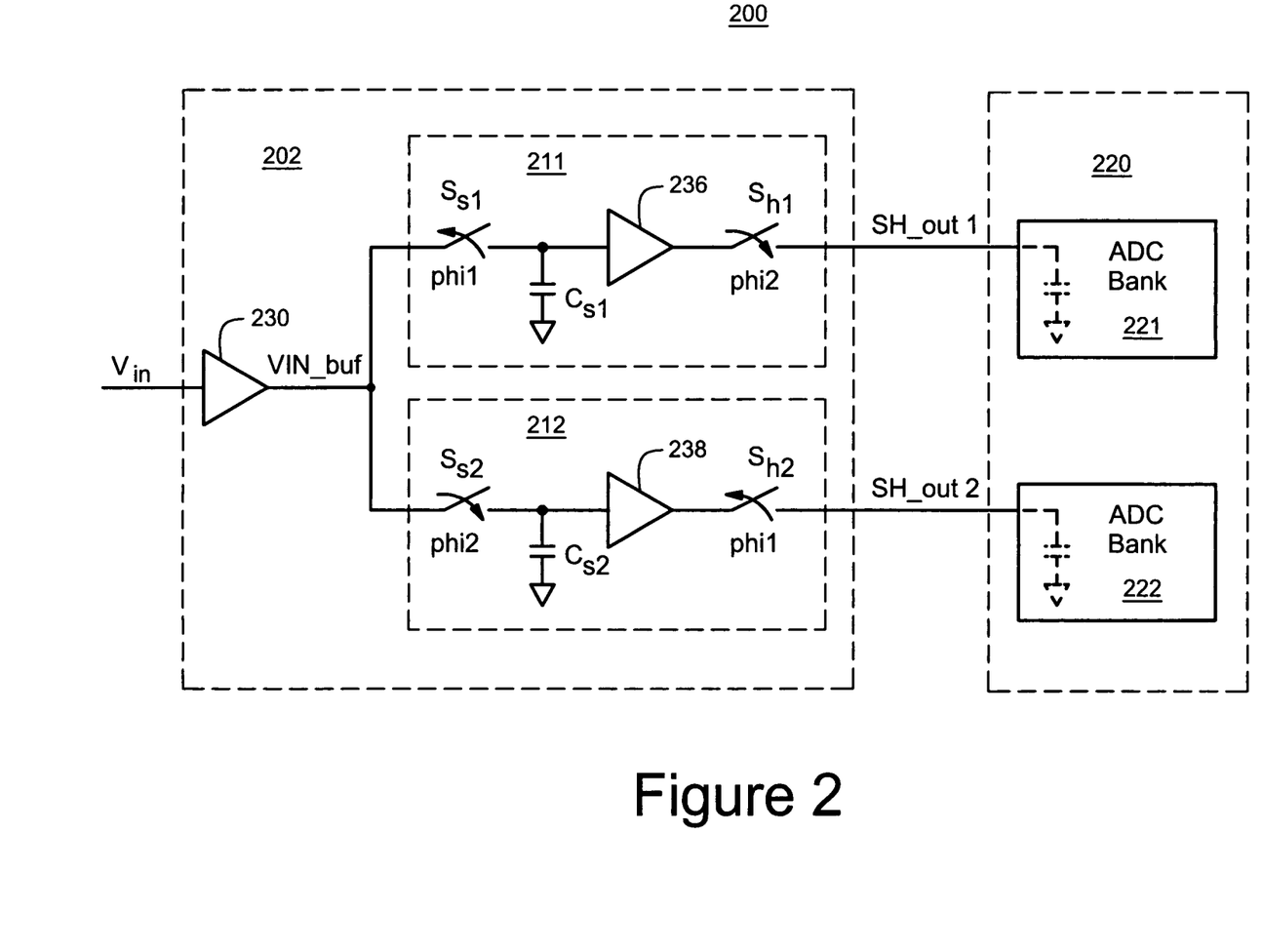
FIG. 2 illustrates a block diagram of an embodiment of the circuit of FIG. 1 that includes buffer circuits.

FIG. 2 illustrates a block diagram of an embodiment of circuit 200 in which the sample-and-hold circuit includes buffer circuits, and the processing circuit is an ADC circuit. Components in circuit 200 may operate in a substantially similar manner to similarly-named components in circuit 100, and may operate in a different manner in some ways. Processing circuit 220 is an interleaved ADC circuit that includes ADC bank 221 and ADC bank 222. Sample-and-hold circuit 202 further includes buffer circuits 236, 238, and 230.

In operation, buffer circuit 230 may provide signal VIN_buf from signal VIN. Buffer circuit 230 may prevent kickback noise created by the switching operation and by transient currents drawn by sampling capacitor circuits $C_{s1}$, and $C_{s2}$. Similarly, buffer circuits 236 and 238 may help stop any constant or transient current drawn by processing circuit 220 that might otherwise corrupt the voltage stored in sampling capacitor circuits $C_{s1}$ and $C_{s2}$ respectively.

Switch circuits $S_{s1}$ and $S_{h2}$ are arranged to be closed if signal phi1 is high, and arranged to be open if signal phi1 is low. Conversely, switch circuits $S_{s2}$ and $S_{h1}$ are arranged to be closed if signal phi2 is high, and arranged to be open if signal phi2 is low. During the hold phase for switch circuit $S_{h1}$, the relatively large input capacitance associated with ADC bank 221 is not coupled to sampling capacitor circuit $C_{s1}$. Also, a break-before-make scheme may be implemented so that a short delay occurs between the time that sampling switch circuit $S_{s1}$ turns off and the time that hold switch circuit $S_{h1}$ turns on, and so that another short delay occurs between the time that hold switch circuit $S_{h1}$ turns off and the time that sampling switch circuit $S_{s1}$ turns on. Additionally, although not shown in FIG. 2, signals phi1 and phi2 are provided from one of more clock signals CLKs.

Sample-and-hold channel 212 operates in a substantially similar manner as sample-and-hold channel 211, except than sample-and-hold channel 212 is sampling when sample-and-hold channel 211 is holding, and vice versa.

Figure 3:
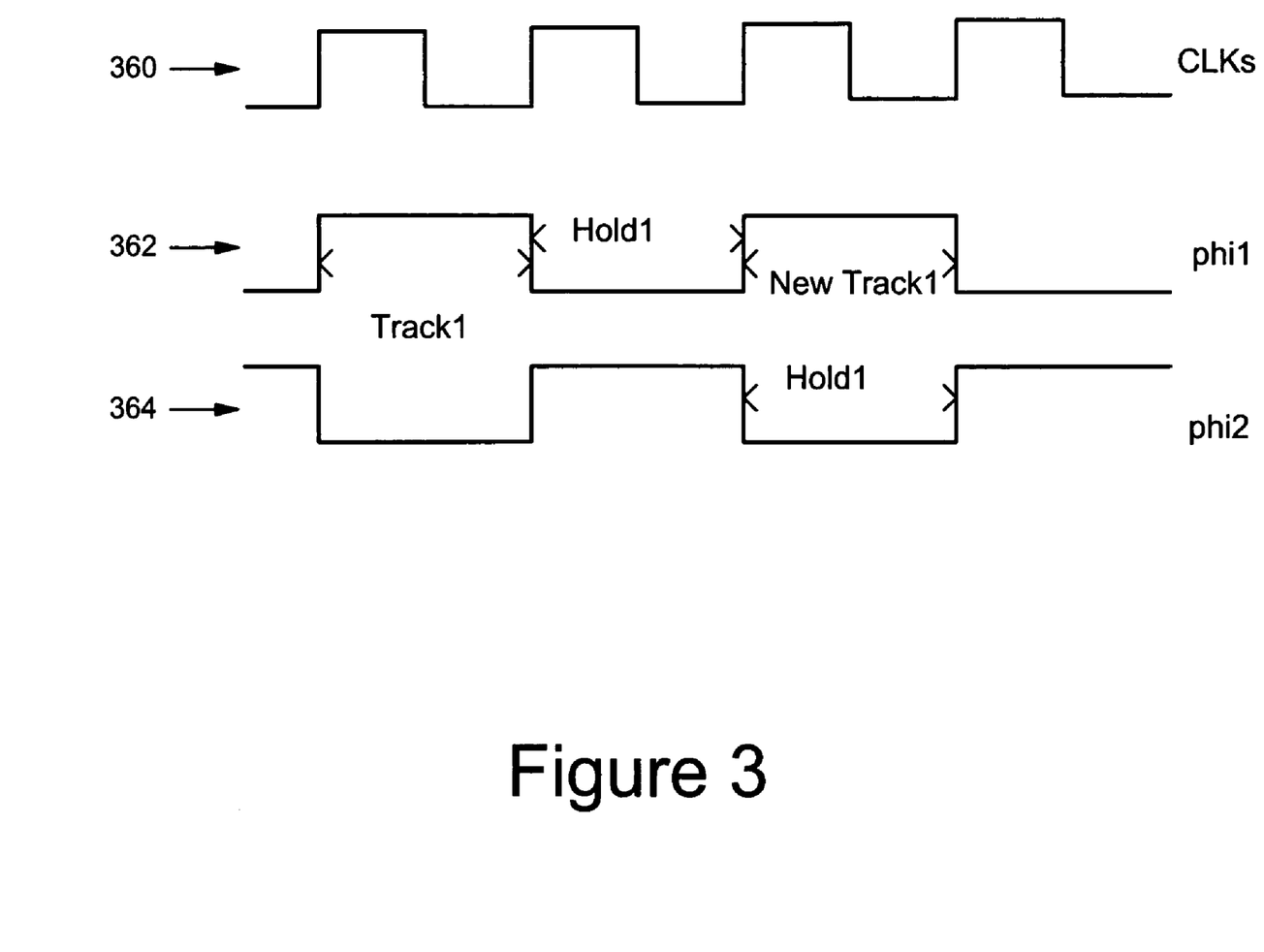
FIG. 3 shows a timing diagram of waveforms of embodiments of signals from the circuit of FIG. 2.

FIG. 3 shows a timing diagram of waveforms of embodiments of signals CLKs, phi1, and phi2 from circuit 200. Waveform 360 shows an embodiment of one or more clock signals CLKs. Waveform 362 shows an embodiment of signal phi1, and waveform 364 shows an embodiment of signal phi2. For the embodiments of signals phi1 and phi2 illustrated in FIG. 3, the period of signals phi1 and phi2 are twice the period of clock signals CLKs. Also, signal phi2 is a substantial inverse of signal phi1. When signal phi1 is high, signal VIN_buf is sampled on sampling capacitor circuit $C_{s1}$. When signal phi1 is low, the sampled signal is held to provide signal SH_out1. When signal phi1 changes from low to high once again, a new signal VIN_buf is sampled again. However, while new signal VIN_buf is being sampled, ADC bank 221 continues processing the old SH_out1 signal, since switch circuit $S_{h1}$ remains open.

Figure 4:
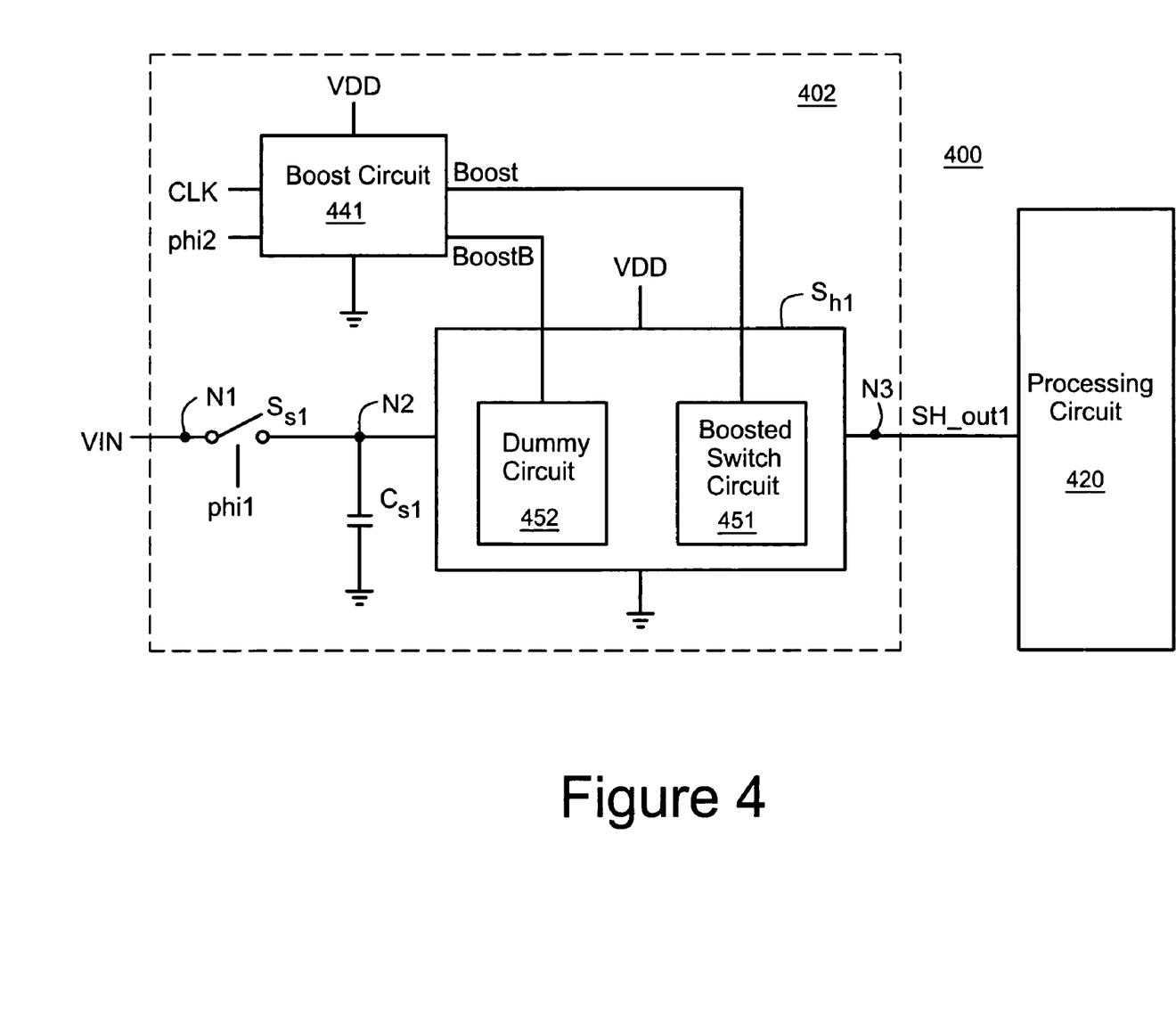
FIG. 4 illustrates a block diagram of an embodiment of a circuit for sampling and holding that includes a boost circuit.

FIG. 4 illustrates a block diagram of an embodiment of circuit 400 that includes a boost circuit. Circuit 400 includes sampling switch circuit $S_{s1}$, capacitor circuit $C_{s1}$, boost circuit 441, processing circuit 420, and holding switch circuit $S_{h1}$. In circuit 400, holding switch circuit $S_{h1}$ includes boosted switch circuit 451 and dummy circuit 452. Components in circuit 400 may operate in a substantially similar manner to similarly-named components in circuit 200 from FIG. 2, and may operate in a different manner in some ways.

In operation, boost circuit 441 provides boost signal Boost and another boost signal BoostB from signals CLKs, phi2, VDD, and GND. Signal BoostB is a substantial inverse of signal Boost. Signals CLKs may include one or more clock signals. Signals CLKs alternate between a low voltage that corresponds to signal GND, and a high voltage that corresponds to VDD. Signals Boost and BoostB alternate between a boosted voltage VDDB and an off voltage $V_{OFF}$. Boosted voltage VDDB is greater than VDD. In one embodiment, off voltage $V_{OFF}$ is substantially similar to signal GND. In other embodiment, voltage $V_{OFF}$ is significantly greater than signal GND. In one embodiment, GND is 0V, VDD is 1.9V, VDDB is 2.6V, and $V_{OFF}$ is 1.0V. In other embodiments, other voltages may be employed.

Sampling switch circuit $S_{s1}$ is arranged to couple node N1 to node N2 if signal phi1 is high. This way, when signal phi1 is high, sampling capacitor circuit $C_{s1}$ stores a charge on to sample voltage VIN. Boosted switch circuit 451 is arranged to receive signal Boost. Further, boosted switch circuit 451 is arranged to couple node N2 to node N3 if signal Boost corresponds to VDDB. Dummy circuit 452 is arranged to cancel charge injection when boosted switch circuit 451 is turned off. Further, dummy circuit 452 is arranged such that dummy circuit 452 is on when signal BoostB corresponds to VDDB, and such that dummy circuit 452 is off when signal BoostB corresponds to voltage $V_{OFF}$. In one embodiment, dummy circuit 452 operates as a capacitor when dummy circuit 452 is on, and may operate substantially as a short circuit when dummy circuit 452 is off.

Figure 5:
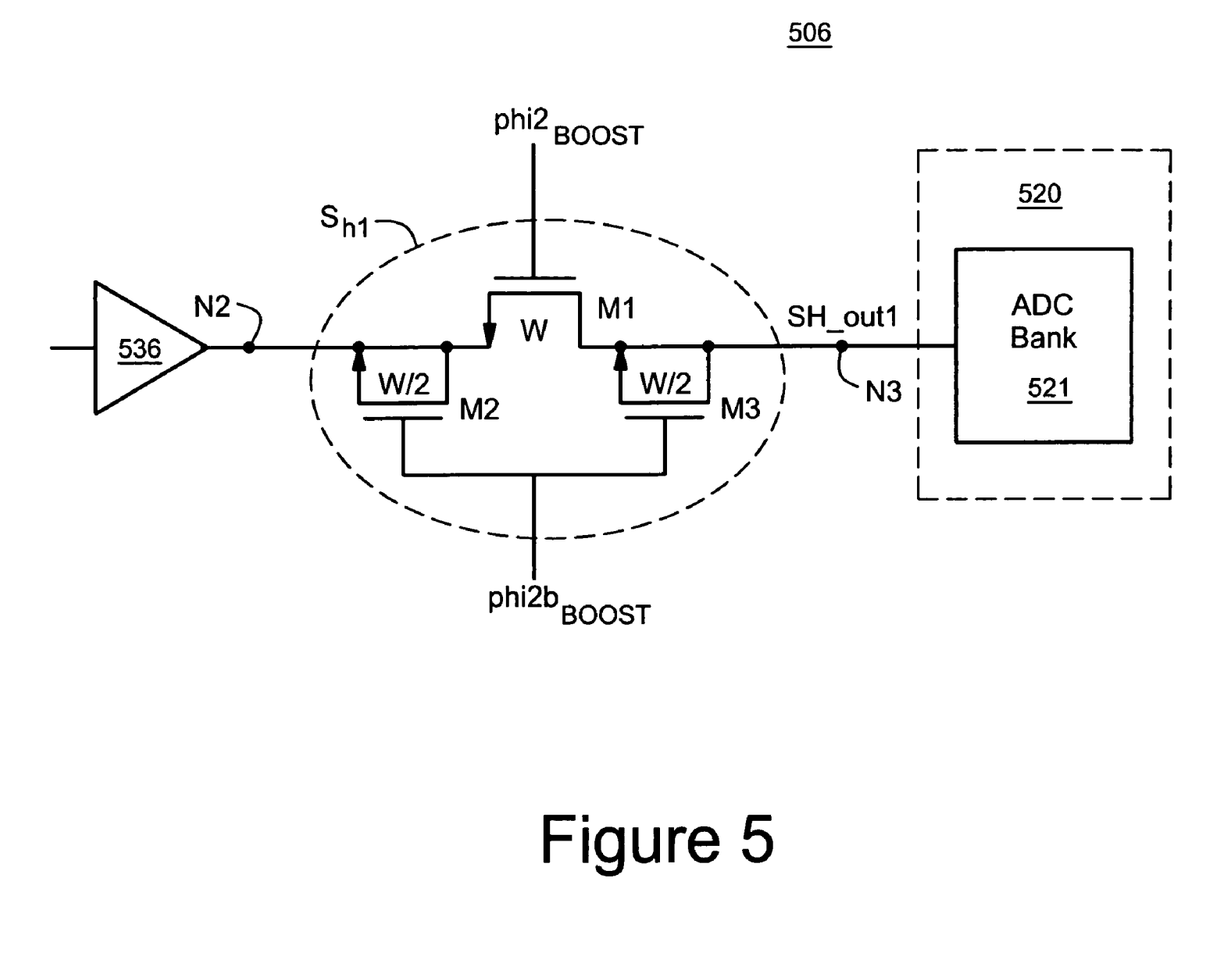
FIG. 5 shows a block diagram of an embodiment of a portion of the circuit of FIG. 4, in which one embodiment of a hold circuit from FIG. 4 is schematically illustrated.

FIG. 5 shows a block diagram of an embodiment of portion 506 of circuit 400 from FIG. 4, in which one embodiment of a hold circuit from FIG. 4 is schematically illustrated. Components in portion 506 may operate in a substantially similar manner to similarly-named components in circuit 400, and may operate in a different manner in some ways. Similarly, signals phi2$_{BOOST}$ and phi2b$_{BOOST}$ may operate in a similar manner as described with regard to signal Boost and BoostB respectively from FIG. 4, and may operate in a different manner in some ways. Portion 506 may further include buffer circuit 536. Processing circuit 520 may include ADC bank 521. Also, in portion 506, holding switch circuit S$_{h1}$ includes transistors M1–M3.

Transistor M1 is arranged to operate as a boosted switch circuit responsive to signal phi2$_{BOOST}$. Transistors M2 and M3 are each arranged to operate as a dummy circuit that is responsive to signal phi2b$_{BOOST}$. More specifically, transistors M2 and M3 are each arranged to store half of the charge injection from transistor M1 when transistor M1 turns off. As shown in FIG. 5, transistor M1 has an associated channel width W, and transistor M2 and M3 each have an associated channel width that is given by approximately W/2.

Figure 6:
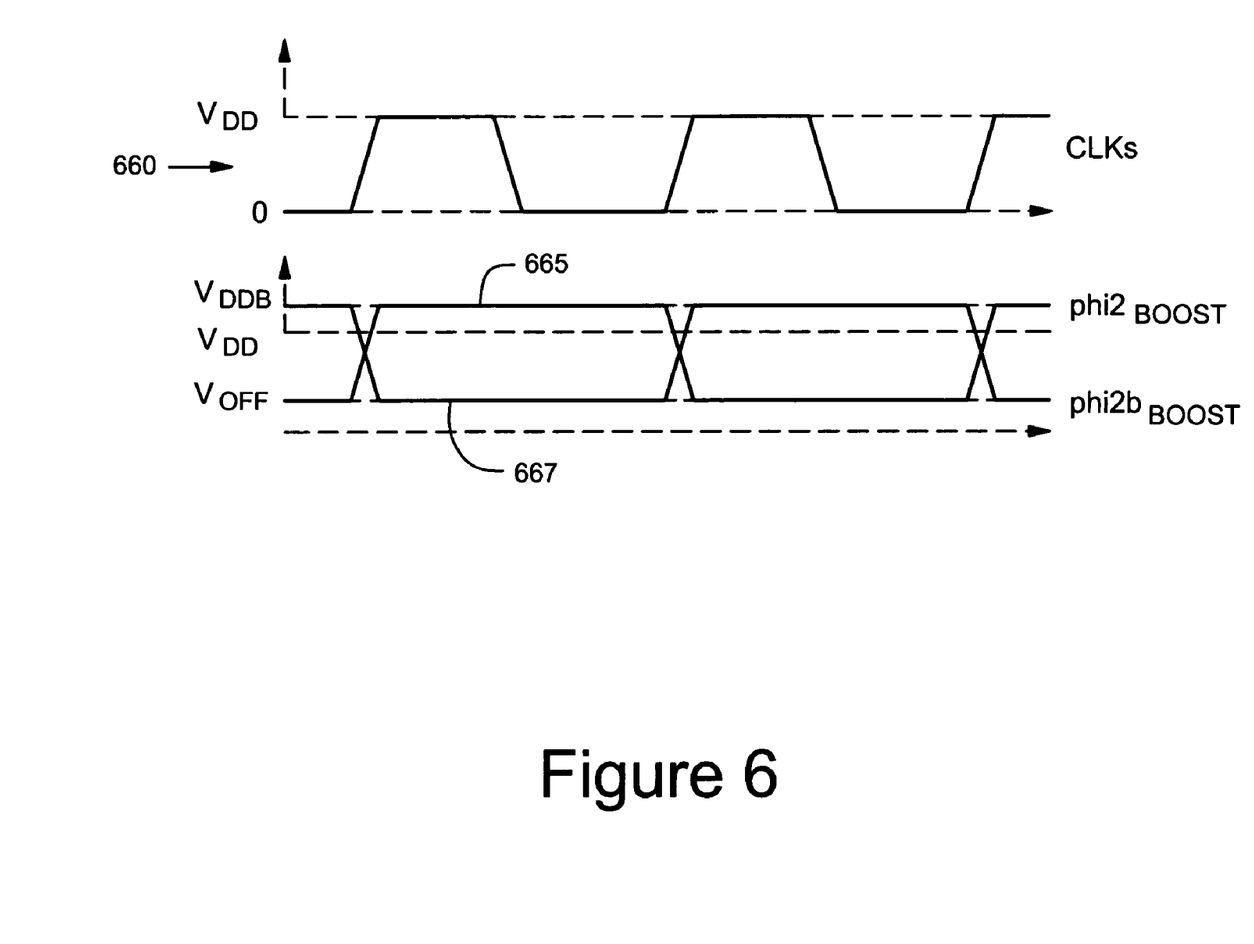
FIG. 6 illustrates a timing diagram of waveforms of embodiments of signals from FIG. 5.

FIG. 6 illustrates a timing diagram of waveforms of embodiments of signals CLKs, phi2$_{BOOST}$ and phi2b$_{BOOST}$ from FIGS. 4 and 5. Waveform 660 illustrates signals CLKs, which alternate between 0V and VDD. Waveform 665 illustrates signal phi2$_{BOOST}$, which alternates between signal VDDB and signal V$_{OFF}$. In the embodiment shown in FIG. 6, VDDB is significantly greater than VDD, and V$_{OFF}$ is significantly greater than 0V. Also, waveform 667 illustrates signal phi2b$_{BOOST}$, which is a substantial inverse of signal 665.

Figure 7:
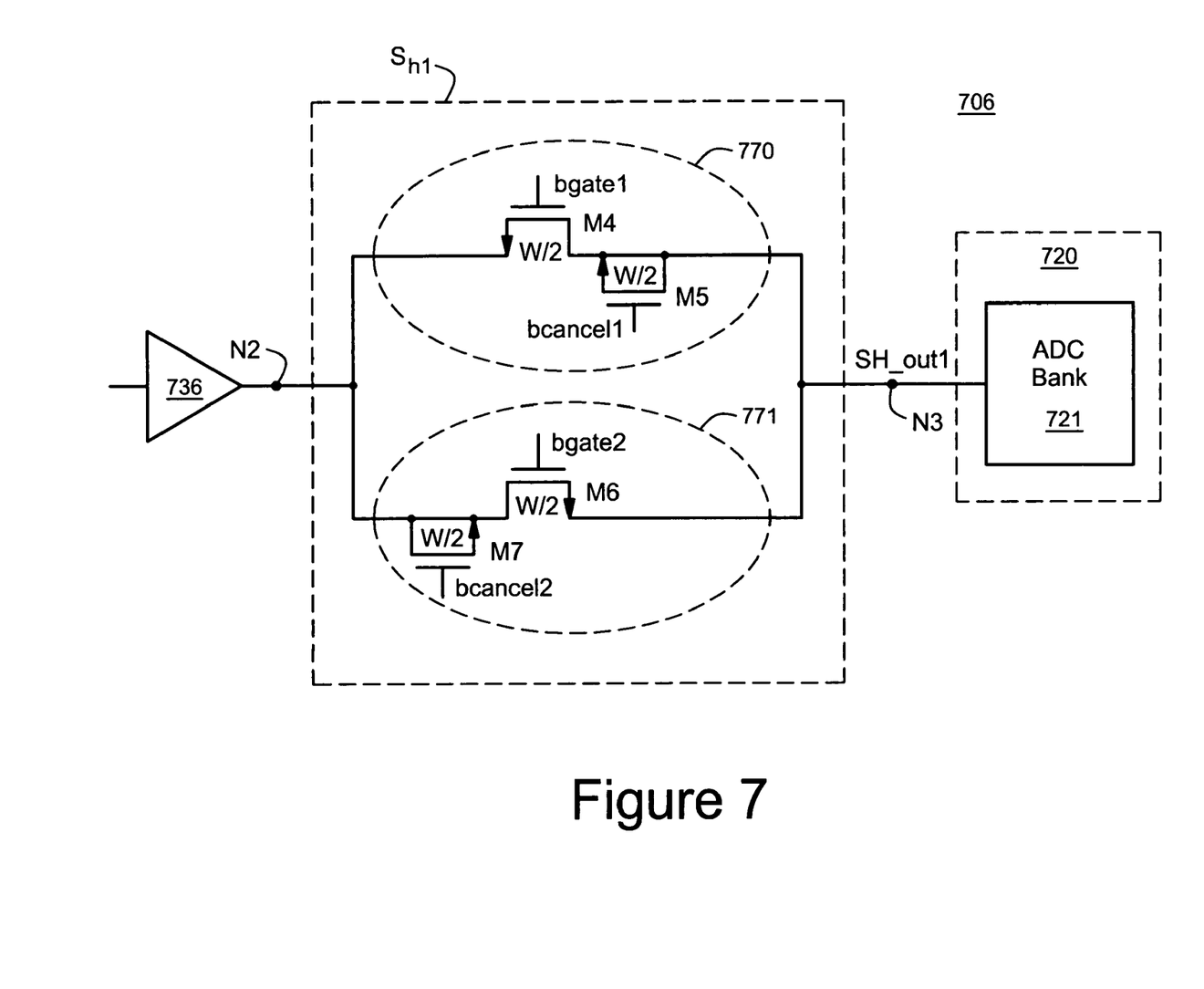
FIG. 7 shows a block diagram of another embodiment of the portion of the sample-and-hold circuit from FIG. 4, in which another embodiment of the hold circuit from FIG. 4 is schematically illustrated.

FIG. 7 shows a block diagram of an embodiment of portion 706 of circuit 400 from FIG. 4, in which another embodiment of hold circuit S$_{h1}$ from FIG. 4 is schematically illustrated. Components in portion 706 may operate in a substantially similar manner to similarly-named components in circuit 400, and may operate in a different manner in some ways. Also, signals bgate1 and bgate2 may operate in a similar manner as described with regard to signal Boost from FIG. 4, and may operate in a different manner in some ways. Similarly, signals bcancel1 and bcancel2 may operate in a similar manner as described with regard to signal BoostB from FIG. 4, and may operate in a different manner in some ways. Portion 706 may further include buffer circuit 736. Processing circuit 720 may include ADC bank 721. Also, in portion 706, holding switch circuit S$_{h1}$ includes half-switch circuit 770 and half-switch circuit 771. Half-switch circuit 770 includes transistors M4 and M5, and half-switch circuit 771 includes transistors M6 and M7.

Transistor M4 and M6 are each arranged to operate as a boosted switch circuit responsive to signals bgate1 and bgate2 respectively. Transistors M5 and M7 are each arranged to operate as a dummy circuit responsive to signals bcancel1 and bcancel2 respectively. As shown in FIG. 7, transistors M4–M7 each have substantially the same channels widths.

Figure 8:
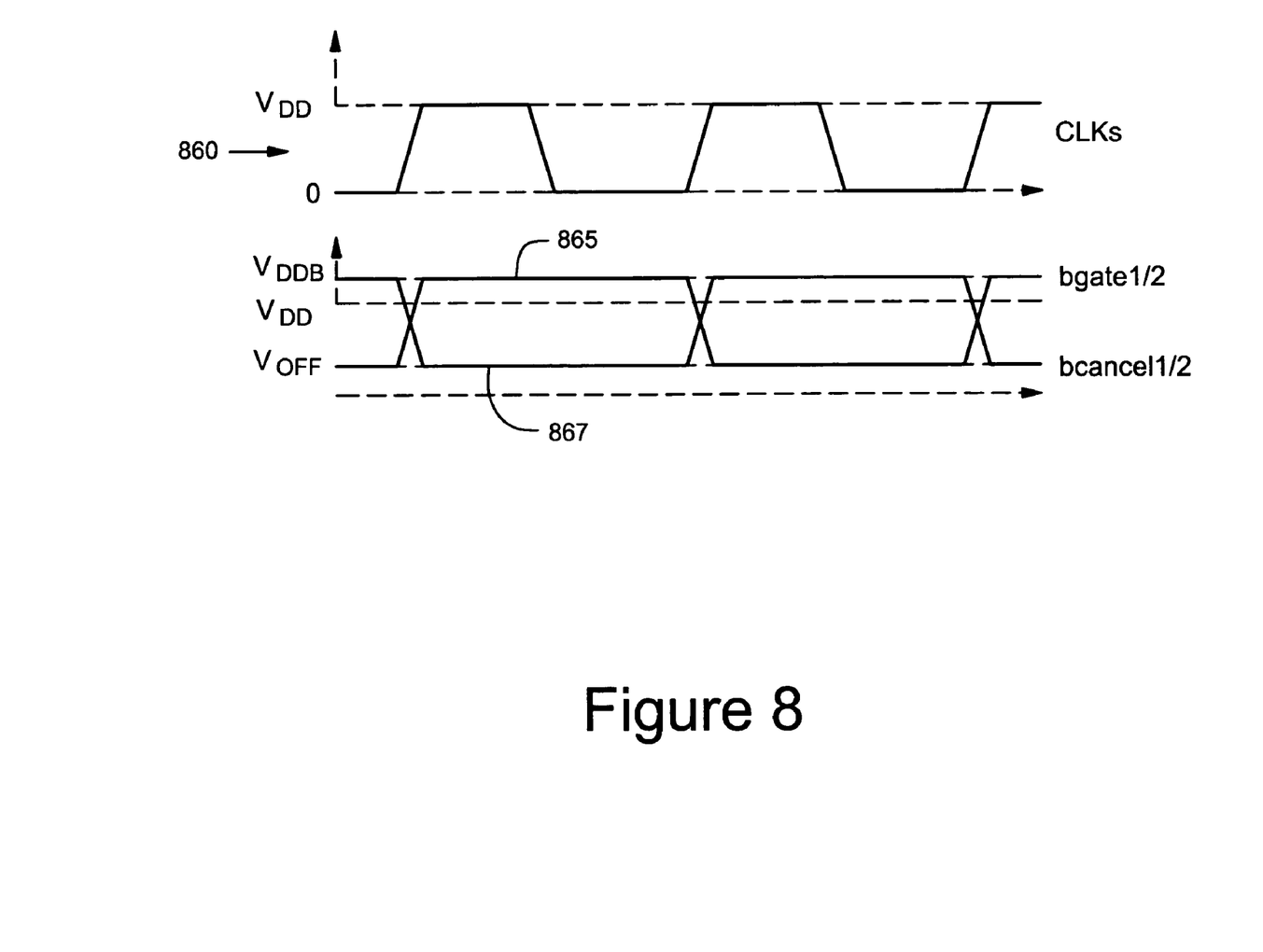
FIG. 8 illustrates a timing diagram of waveforms of embodiments of signals from FIG. 7.

FIG. 8 illustrates a timing diagram of waveforms of embodiments of signals CLKs, bgate1, bgate2, bcancel1, and bcancel2 from FIGS. 4 and 7. Waveform 860 illustrates signals CLKs, which alternate between 0V and VDD. Waveform 865 illustrates signals bgate1 and bgate2, which each alternate between signal VDDB and signal V$_{OFF}$. In the embodiment shown in FIG. 8, VDDB is significantly greater than VDD, and V$_{OFF}$ is significantly greater than 0V. Also, waveform 867 illustrates signals bcancel1 and bcancel2, which are each substantial inverses of signal bgate1.

Figure 9:
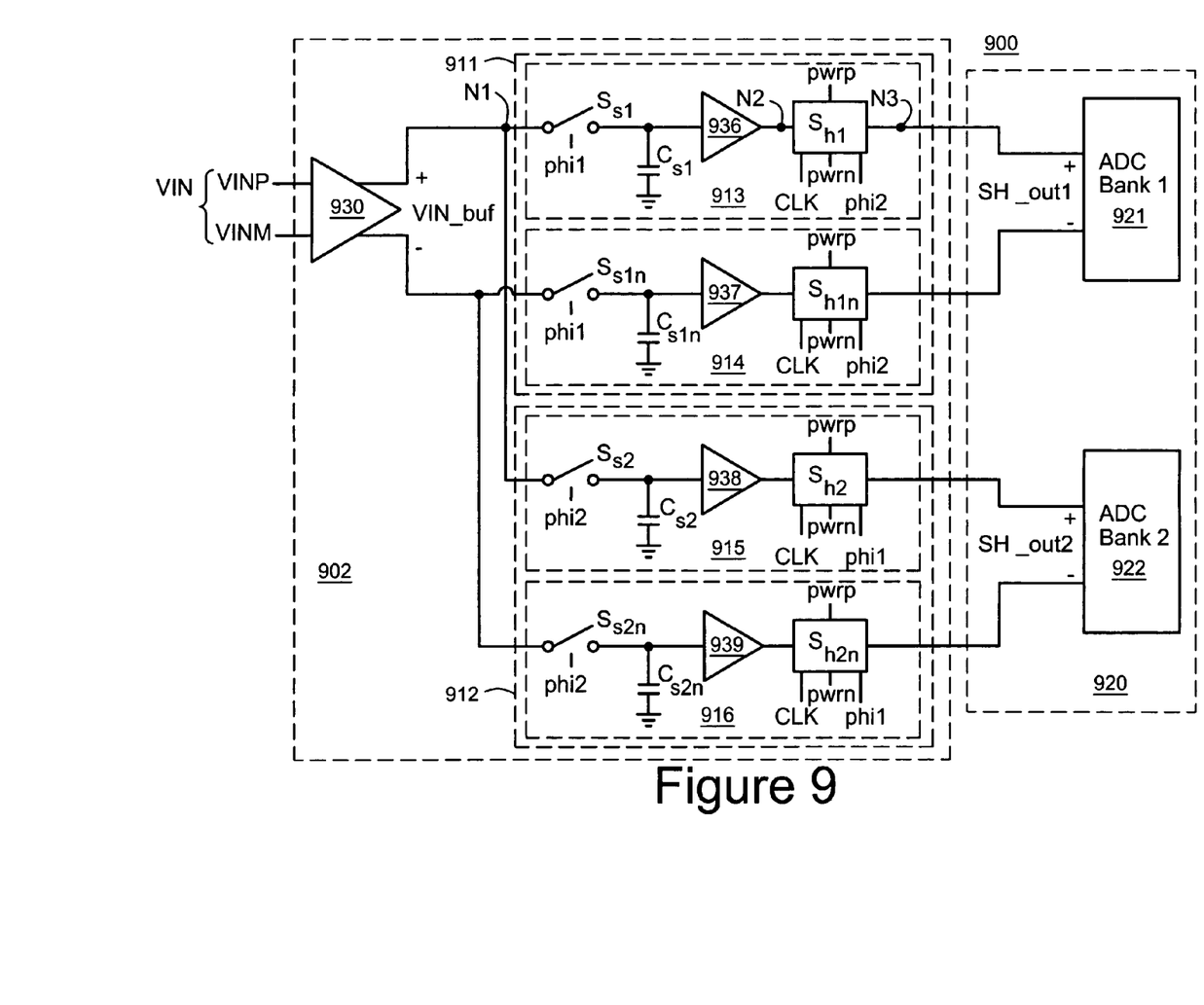
FIG. 9 shows a block diagram of an embodiment of the circuit of FIG. 4 that is pipelined and differential.

FIG. 9 shows a block diagram of circuit 900. Components in circuit 900 may operate in a substantially similar manner to similarly-named components in circuit 400, and may operate in a different manner in some ways. Circuit 900 includes sample-and-hold circuit 902 and processing circuit 920. Processing circuit 920 includes ADC bank 921 and ADC bank 922. Sample-and-hold circuit 902 includes buffer circuit 930, differential sample-and-hold channel 911 and differential sample-and-hold channel 912. Differential sample-and-hold channel 911 includes sample-and-hold channel 913 and sample-and-hold channel 914. Differential sample-and-hold channel 912 includes sample-and-hold channel 915 and sample-and-hold channel 916. Sample-and-hold channel 913 includes switch circuit S$_{s1}$, sampling capacitor circuit C$_{s1}$, buffer circuit 936, and hold circuit S$_{h1}$. Sample-and-hold channel 914 includes switch circuit S$_{s1n}$, sampling capacitor circuit C$_{s1n}$, buffer circuit 937, and hold circuit S$_{h1n}$. Sample-and-hold channel 915 includes switch circuit S$_{s2}$, sampling capacitor circuit C$_{s2}$, buffer circuit 938, and hold circuit S$_{h2}$. Sample-and-hold channel 916 includes switch circuit S$_{s2n}$, sampling capacitor circuit C$_{s2n}$, buffer circuit 939, and hold circuit S$_{h2n}$.

In operation, buffer circuit 930 provides signal VIN_buf from signal VIN. In circuit 900, signals VIN and VIN_buf, SH_out1 and SH_out2 are differential signals. Also, differential sample-and-hold channel 911 is arranged to provide signal SH_out1 from signal VIN_buf. More specifically, sample-and-hold channel 913 is arranged to provide a first half of differential signal SH_out1 from a first half of differential signal VIN_buf, and sample-and-hold channel 914 is arranged to provide a second half of differential signal from a second half of differential signal VIN_buf. Differential sample-and-hold channel 912 is arranged to provide signal SH_out2 from signal VIN_buf in a similar manner.

Figure 10:
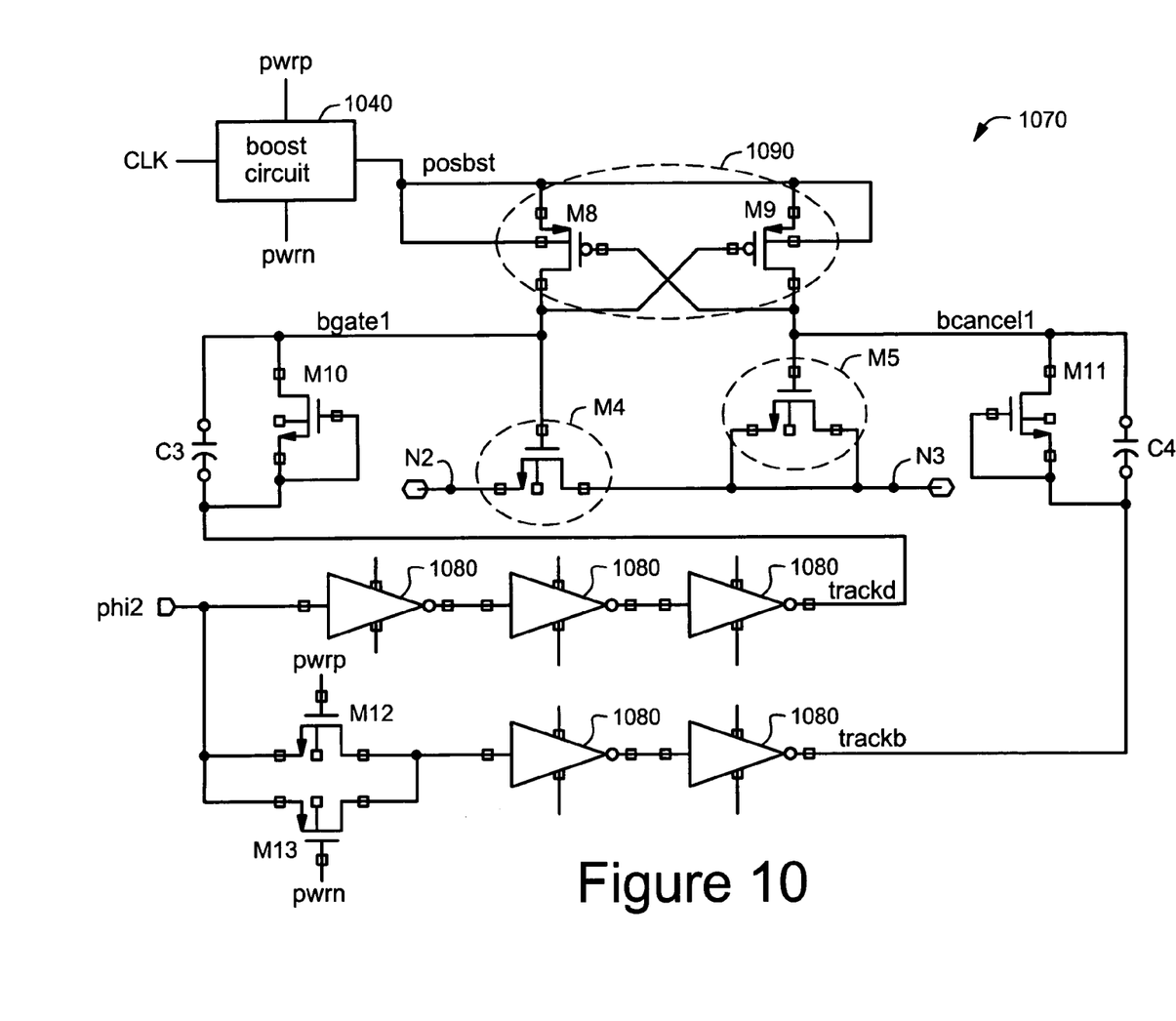
FIG. 10 schematically illustrates an embodiment of a half-switch circuit from FIG. 7.

FIG. 10 schematically illustrates an embodiment of half-switch circuit 1070. Components in half-switch circuit 1070 may operate in a substantially similar manner as similarly-named components in half-switch circuit 770 of FIG. 7, and may operate in a different manner in some ways. Half-switch circuit 1070 further includes boost circuit 1040, cross-coupled transistors 1090, inverters 1080, transistors M10–M13, and capacitors C3 and C4. Cross-coupled transistors 1090 include transistors M8 and M9.

Boost circuit 1040 is arranged to provide signal posbst from signals CLK, pwrp, and pwrn such that signal posbst has an associated voltage that is greater than a voltage that is associated signal pwrp. Signal pwrp is a high power supply signal, and signal pwrn is a low power supply signal. In one embodiment, signal pwrp corresponds to 1.9V, signal pwrn corresponds to 0V, and signal posbst corresponds to 2.6V.

Additionally, cross-coupled transistors 1090 are arranged to connect and disconnect the gates of transistors M4 and M5 from signal posbst. Transistors M10 and M11 are each arranged as a diode to provide gate oxide stress protection.

Inverters 1080 and transistors M12–M13 are arranged to provide signals trackd and trackb from signal phi2. Capacitor C3 is arranged to provide the clock timing from signal trackd to signal bgate1. Similarly, capacitor C4 is arranged to provide the clock timing from signal trackb to signal bcancel1.

Figure 11:
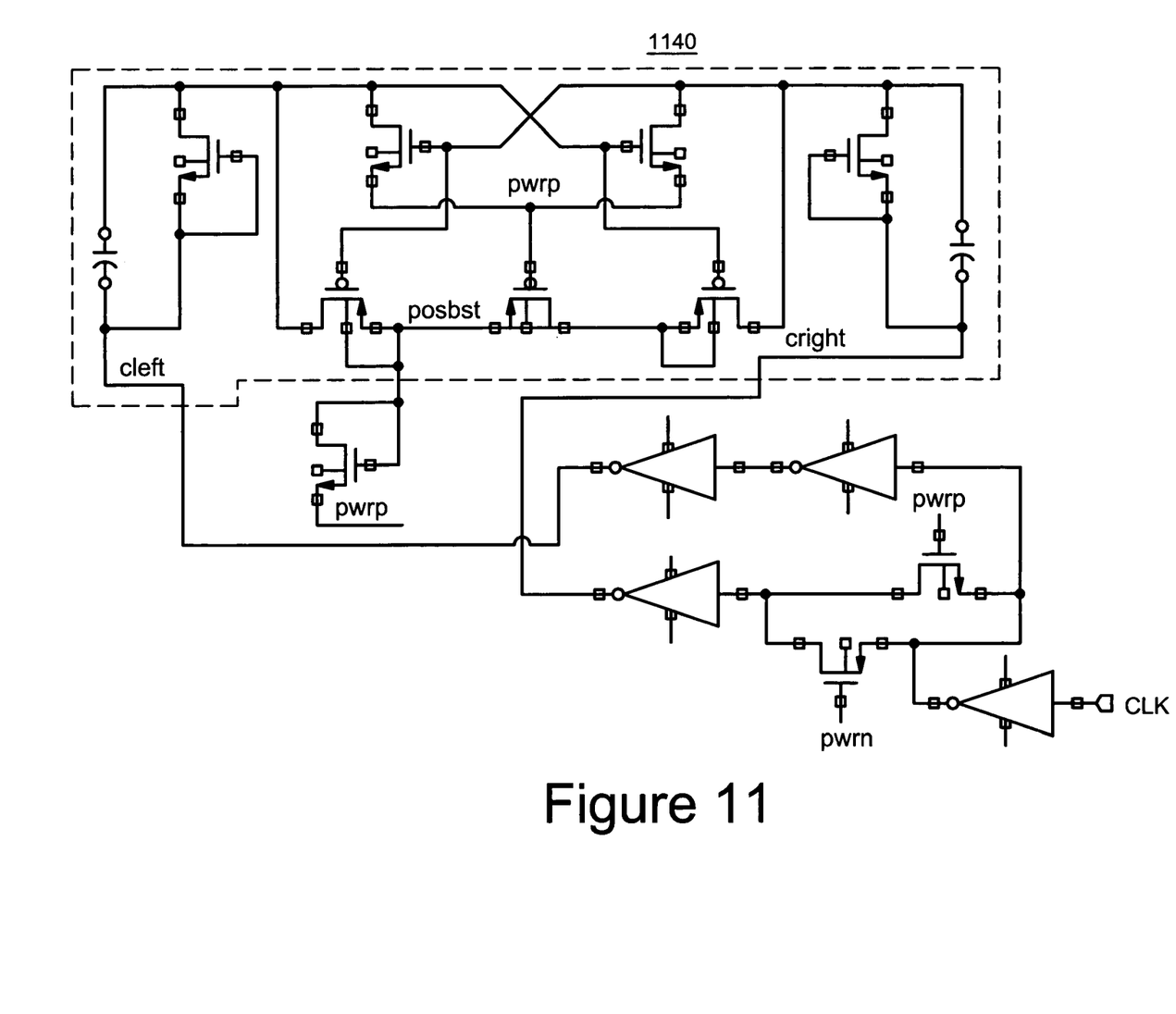
FIG. 11 schematically illustrates an embodiment of a boost switch circuit from FIG. 10, arranged in accordance with aspects of the present invention.

FIG. 11 schematically illustrates an embodiment of a boost switch circuit 1140. Boost switch circuit 1140 may operate in a substantially similar manner as described with regard to boost circuit 1040 from FIG. 10, and may operate in a different manner in some ways.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for sampling and holding, comprising:
   a processing circuit that is interleaved such that the processing circuit comprises a first processing channel and a second processing channel;
   a first sample-and-hold channel, comprising:
      a first sampling switch circuit that is coupled between a first node and a second node;
      a first sampling capacitor circuit that is coupled to the second node; and
      a first holding switch circuit that is coupled between the second node and the first processing channel; and
   a second sample-and-hold channel, comprising:
      a second sampling switch circuit that is coupled between the first node and a third node;
      a second sampling capacitor circuit that is coupled to the third node; and
      a second holding switch circuit that is coupled between the third node and the second processing channel, wherein the first sampling switch circuit is configured to be closed during a sample phase for the first sample-and-hold channel, the first sampling switch circuit is configured to be open during a hold phase for the first sample-and-hold channel, the first holding switching circuit is configured to be closed during the hold phase for the first sample-and-hold channel, a sample voltage is sampled at the second node during the sample phase for the first sample-and-hold channel, and wherein the voltage at the second node is substantially equal to the sample voltage during the hold phase for the first sample-and-hold channel.

2. The circuit of claim 1, further comprising a buffer circuit having an output that is coupled to the first node.

3. The circuit of claim 1, wherein the first sample-and-hold channel further comprises a buffer circuit that is coupled between the first sampling switch and the first holding switch circuit, and wherein the second sample-and-hold channel further comprises another buffer circuit that is coupled between the second sampling switch and the second holding switch circuit.

4. A circuit for sampling and holding, comprising:
   a processing circuit that is interleaved such that the processing circuit comprises a first processing channel and a second processing channel;
   a first sample-and-hold channel, comprising:
      a first sampling switch circuit that is coupled between a first node and a second node;
      a first sampling capacitor circuit that is coupled to the second node; and
      a first holding switch circuit that is coupled between the second node and the first processing channel; and
   a second sample-and-hold channel, comprising:
      a second sampling switch circuit that is coupled between the first node and a third node;
      a second sampling capacitor circuit that is coupled to the third node; and
      a second holding switch circuit that is coupled between the third node and the second processing channel, wherein the first sampling switch circuit is configured to be closed during a sample phase for the first sample-and-hold channel, and wherein the first hold switch circuit is configured to be open during the sample phase for the first sample-and-hold channel, wherein:
   the first sampling switch circuit is further configured to be open during a hold phase for the first sample-and-hold channel;
   the first hold switch circuit is further configured to be closed during the hold phase for the first sample-and-hold channel;
   the second sampling switch circuit is configured to be closed during a sample phase for the second sample-and-hold channel, and further configured to be open during a hold phase for the second sample-and-hold channel; and wherein
   the second hold switch circuit is configured to be open during the sample phase for the second sample-and-hold channel, and further configured to be closed during the hold phase for the second sample-and-hold channel.

5. The circuit of claim 4, wherein the sample phase for the first sample-and-hold channel takes half of a period of a sampling control signal and occurs once per period of the sampling control signal, and wherein the first sample-and-hold channel is arranged such that the first processing channel has an amount of time substantially equal to one full period of the sampling control signal to process a signal received from the first holding switch circuit.

6. The circuit of claim 4, wherein the sample phase for the first sample-and-hold channel occurs at substantially the same time as the hold phase for the second sample-and-hold channel, and wherein the hold phase for the first sample-and-hold channel occurs at substantially the same time as the sample phase for the second sample-and-hold channel.

7. A circuit for sampling and holding, comprising:
   a processing circuit that is interleaved such that the processing circuit comprises a first processing channel and a second processing channel;
   a first sample-and-hold channel, comprising:
      a first sampling switch circuit that is coupled between a first node and a second node;
      a first sampling capacitor circuit that is coupled to the second node; and
      a first holding switch circuit that is coupled between the second node and the first processing channel; and
   a second sample-and-hold channel, comprising:
      a second sampling switch circuit that is coupled between the first node and a third node;
      a second sampling capacitor circuit that is coupled to the third node; and
   a second holding switch circuit that is coupled between the third node and the second processing channel, wherein the processing circuit includes an interleaved analog-to-digital conversion circuit, the first processing channel includes a first bank of the interleaved analog-to-digital conversion circuit, and the second processing channel includes a second bank of the interleaved analog-to-digital conversion circuit.

8. A circuit for sampling and holding, comprising:
   a processing circuit that is interleaved such that the processing circuit comprises a first processing channel and a second processing channel;
   a first sample-and-hold channel, comprising:
      a first sampling switch circuit that is coupled between a first node and a second node;
      a first sampling capacitor circuit that is coupled to the second node; and
      a first holding switch circuit that is coupled between the second node and the first processing channel; and
   a second sample-and-hold channel, comprising:
      a second sampling switch circuit that is coupled between the first node and a third node;
      a second sampling capacitor circuit that is coupled to the third node; and
   a second holding switch circuit that is coupled between the third node and the second processing channel; and
      a boost circuit that is configured to provide a boosted signal from a clock signal such that the boosted signal substantially corresponds to a boosted voltage during a hold phase, wherein the clock signal is configured to alternate between a first voltage level and a second voltage level, the second voltage level corresponds to a high power supply voltage, and wherein the boosted voltage exceeds the high power supply voltage.

9. The circuit of claim 8, wherein the first and second holding switch circuits each include:
   a first boosted switch circuit that is configured to open and close in response to the boosted signal; and
   a first dummy circuit that is configured to absorb channel charge from the boosted switch circuit if the boosted switch circuit closes.

10. A circuit for sampling and holding, comprising:
   a first sampling switch circuit that is coupled between a first node and a second node;
   a sampling capacitor circuit that is coupled to the second node;
   a holding switch circuit that is coupled between the second node and a third node, wherein the holding switch comprises:
      a first boosted switch circuit that is configured to open and close in response to a boosted signal; and
      a first dummy circuit that is configured to absorb channel charge from the boosted switch circuit if the boosted switch circuit closes; and
   a boost circuit that is configured to provide the boosted signal from a clock signal such that the boosted signal substantially corresponds to a boosted voltage during a hold phase, and such that the boosted voltage exceeds a high power supply voltage, wherein the clock signal is configured to alternate between a first voltage level and a second voltage level, and wherein the second voltage level corresponds to the high power supply voltage.

11. The circuit of claim 10, wherein the boosted signal corresponds to an off voltage during a sample phase, the off voltage is significantly greater than a low power supply voltage, and wherein the first voltage level corresponds to the low power supply voltage.

12. The circuit of claim 10, wherein the holding switch circuit further includes a second dummy circuit.

13. The circuit of claim 12, wherein the first dummy circuit is configured to receive an inverted boosted signal, the second dummy circuit is configured to receive another inverted boosted signal, and wherein the inverted boosted signal and the other inverted boosted signal are each a substantial inverse of the boosted signal.

14. The circuit of claim 12, wherein the first and second dummy circuits each include an associated width that is approximately half of a width that is associated with the first boosted switch circuit.

15. The circuit of claim 12, wherein the first dummy circuit is coupled between the second node and the first boosted switch circuit, and wherein the second dummy circuit is coupled between the first boosted switch circuit and the third node.

16. The circuit of claim 12, wherein the holding switch circuit further includes:
   a second boosted switch circuit that is configured to open and close in response to another boosted signal, wherein the other boosted signal is substantially the same as the boosted signal.

17. The circuit of claim 16, wherein the first boosted switch circuit, the second boosted switch circuit, the first dummy circuit, and the second dummy circuit are each substantially the same size.

18. The circuit of claim 16, wherein the first boosted switch circuit is coupled between the second node and the first dummy circuit, the first dummy circuit is coupled between the first boosted switch circuit and the third node, the second dummy circuit is coupled between the second node and the second boosted circuit, and wherein the second boosted switch circuit is coupled between the second dummy circuit and the third node.

19. The circuit of claim 12, wherein the first dummy circuit includes a first n-type transistor including a drain that is coupled to a source of the first n-type transistor, the second dummy circuit includes a second n-type transistor including a drain that is coupled to a source of the second n-type transistor, and wherein the first boosted switch circuit includes a third n-type transistor.

20. A circuit for sampling and holding, comprising:
   a means for coupling a first node to a second node during a sample phase;
   a means for storing charge at the second node;
   a means for providing a boosted signal from a clock signal such that the boosted signal substantially corresponds to a boosted voltage during the hold phase, and such that the boosted voltage exceeds a high power supply voltage, wherein the clock signal is configured to alternate between a first voltage level and a second voltage level, and wherein the second voltage level corresponds to the high power supply voltage; and
   a means for coupling a second node to a third node during a hold phase, comprising:
      a means for opening and closing a boosted switch circuit in response to the boosted signal; and
      a means for absorbing channel charge from the boosted switch circuit if the boosted switch circuit closes, wherein the means for absorbing the channel charge is responsive to another boosted signal.

21. A circuit for sampling and holding, comprising:
   a processing circuit that is operable to provide a digital output signal, wherein the processing circuit is time-interleaved such that the processing circuit includes a first processing channel that is operable to provide the digital output signal at a first time and a second processing channel that is operable to provide the digital output signal at a second time;
   a sample-and-hold circuit that is interleaved by at least two such that a speed of the sample-and-hold circuit is approximately at least doubled without substantially decreasing the processing time allowed for the processing circuit; and a boost circuit that is coupled to the sample-and-hold circuit, wherein the boost circuit is capable of providing a boosted voltage that exceeds a power supply voltage.

22. A circuit for sampling and holding, comprising:
   a processing circuit that is interleaved such that the processing circuit includes a first processing channel and a second processing channel;
   a first sample-and-hold channel that is coupled to the first processing channel;
   a boost circuit that is coupled to the first sample-and-hold channel, wherein the boost circuit is capable of providing a boosted voltage that exceeds a power supply voltage; and
   a second sample-and-hold channel that is coupled to the second processing channel, wherein the second sample-and-hold channel is coupled to the first sample-and-hold channel.

* * * * *

UNITED STATES PATENT AND TRADEMARK OFFICE
CERTIFICATE OF CORRECTION

PATENT NO. : 7,015,729 B1 Page 1 of 1
APPLICATION NO. : 10/816322
DATED : March 21, 2006
INVENTOR(S) : Maria Rosaria Tursi et al.

It is certified that error appears in the above-identified patent and that said Letters Patent is hereby corrected as shown below:

In the Specification:

First Page Col. 2 (Other Publications), Line 2, Delete "anc" and insert -- and --.

First Page Col. 2 (Other Publications), Line 4, Delete "0.25um" and insert

-- 0.25-um--.

Column 3, Line 7, Delete "sample-and- hold" and insert -- sample-and-hold--.

Column 3, Line 53, Delete "$C_{s1}$," and insert - - $C_{s1}$ - -.

Signed and Sealed this

Twenty-second Day of August, 2006

JON W. DUDAS
*Director of the United States Patent and Trademark Office*